US009978444B2

(12) United States Patent
Kwok et al.

(10) Patent No.: US 9,978,444 B2
(45) Date of Patent: May 22, 2018

(54) SENSE AMPLIFIER ENABLING SCHEME

(71) Applicant: QUALCOMM Incorporated, San Diego, CA (US)

(72) Inventors: Tony Chung Yiu Kwok, Irvine, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/077,636

(22) Filed: Mar. 22, 2016

(65) Prior Publication Data

US 2017/0278563 A1 Sep. 28, 2017

(51) Int. Cl.
*G11C 11/00* (2006.01)
*G11C 11/419* (2006.01)
*G11C 7/08* (2006.01)
*G11C 7/22* (2006.01)
*G11C 8/18* (2006.01)
*G11C 7/10* (2006.01)

(52) U.S. Cl.
CPC .............. *G11C 11/419* (2013.01); *G11C 7/08* (2013.01); *G11C 7/227* (2013.01); *G11C 8/18* (2013.01); *G11C 7/1039* (2013.01); *G11C 7/1042* (2013.01); *G11C 2207/229* (2013.01); *G11C 2207/2209* (2013.01); *G11C 2207/2281* (2013.01)

(58) Field of Classification Search
CPC ............ G11C 2207/2209; G11C 11/41; G11C 11/412; G11C 11/413
USPC .............................................. 365/189.04, 154
See application file for complete search history.

(56) References Cited

U.S. PATENT DOCUMENTS 6,115,308 A * 9/2000 Hanson ................ G11C 7/1039
365/205
6,411,557 B2 6/2002 Terzioglu et al.
(Continued)

FOREIGN PATENT DOCUMENTS

JP H09231766 A 9/1997

OTHER PUBLICATIONS

International Search Report and Written Opinion—PCT/US2017/019728—ISA/EPO—dated Jun. 23, 2017.
(Continued)

*Primary Examiner* — Huan Hoang
(74) *Attorney, Agent, or Firm* — Arent Fox, LLP and Qualcomm

(57) ABSTRACT

A memory and a method for operating the memory are presented. The memory includes a memory cell, a sense amplifier configured to sense read data from the memory cell, a write driver configured to provide write data to the memory cell, a first circuit configured to enable the sense amplifier during a time period, and a second circuit configured to enable the write driver during at least a portion of the time period. The method includes enabling a sense amplifier to sense read data from a memory cell during a time period and enabling a write driver to provide write data to the memory cell during at least a portion of the time period. Another memory and method for operating the memory are presented. The memory and method further include an address input circuit configured to receive a write address while the sense amplifier is enabled.

20 Claims, 9 Drawing Sheets

(56) References Cited

U.S. PATENT DOCUMENTS

| | | | |
|---|---|---|---|
| 6,556,482 B2* | 4/2003 | Shimoyama | G11C 7/22 365/189.04 |
| 6,882,562 B2 | 4/2005 | Beucler | |
| 6,967,861 B2* | 11/2005 | Braceras | G11C 11/413 365/154 |
| 7,760,562 B2 | 7/2010 | Jung et al. | |
| 7,839,713 B1 | 11/2010 | Yu et al. | |
| 2001/0024382 A1* | 9/2001 | Shimoyama | G11C 7/22 365/189.011 |
| 2002/0031035 A1 | 3/2002 | Tsuji et al. | |
| 2007/0180006 A1* | 8/2007 | Gyoten | G06F 13/1652 708/200 |
| 2008/0002498 A1* | 1/2008 | Cho | G11C 7/065 365/208 |
| 2011/0149667 A1 | 6/2011 | Hamzaoglu et al. | |
| 2013/0159757 A1 | 6/2013 | Park et al. | |
| 2014/0063926 A1* | 3/2014 | Lee | G11C 7/1045 365/163 |
| 2014/0153349 A1 | 6/2014 | Wu et al. | |
| 2015/0067290 A1 | 3/2015 | Chaba et al. | |

OTHER PUBLICATIONS

Iwabuchi M., et al., "A 1.5-ns Cycle-Time 18-kb Pseudo-Dual-Port RAM with 9K Logic Gates," IEEE Journal of Solid-State Circuits, Apr. 1994, vol. 29 (4), pp. 419-425.

* cited by examiner

SENSE AMPLIFIER ENABLING SCHEME

BACKGROUND

Field

The present disclosure relates generally to memory circuits, and more particularly, to a memory with an improved sense amplifier (SA) enabling scheme.

Background

Memory is a vital component for wireless communication devices (e.g., integrated as part of an application processor in a cell phone). Many of the wireless applications depend on the functionality of a dual port memory, e.g., a memory capable of handling both a read and a write operation within a single clock cycle. A dual port memory typically includes two ports operating with an array of memory cells, which may be simultaneously accessed from both ports. For example, a dual port memory may access two different memory locations (addresses) in a single cycle. In order to reduce the size of the memory, a pseudo-dual port or PDP memory may be used in place of the dual port memory. The core of the PDP memory may be a single-core memory. Accordingly, the memory array of the PDP memory may allow for a single memory access at one instance and not two simultaneous memory accesses as with the dual port memory. The PDP memory may emulate the dual port memory in having two ports. In one implementation, the PDP memory may sequentially perform a read operation and then a write operation to satisfy the dual port function.

With the ever increasing demands for more processing capability, one design challenge is to improve the performance of the PDP memory. For example, reducing the cycle time of the PDP memory may open the PDP memory to more applications.

SUMMARY

Aspects of a memory are disclosed. The memory includes a memory cell, a sense amplifier configured to sense read data from the memory cell, a write driver configured to provide write data to the memory cell, a first circuit configured to enable the sense amplifier during a time period, and a second circuit configured to enable the write driver during at least a portion of the time period.

Aspects of a method for operating a memory are disclosed. The method includes enabling a sense amplifier to sense read data from a memory cell during a time period and enabling a write driver to provide write data to the memory cell during at least a portion of the time period.

Further aspects of a memory are disclosed. The memory includes a memory cell, a sense amplifier configured to sense read data from the memory cell, a circuit configured to enable the sense amplifier, and an address input circuit configured to receive a write address while the sense amplifier is enabled.

Further aspects of a method for operating a memory are disclosed. The method includes enabling a sense amplifier to sense read data from a memory cell and receiving a write address while the sense amplifier is enabled.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
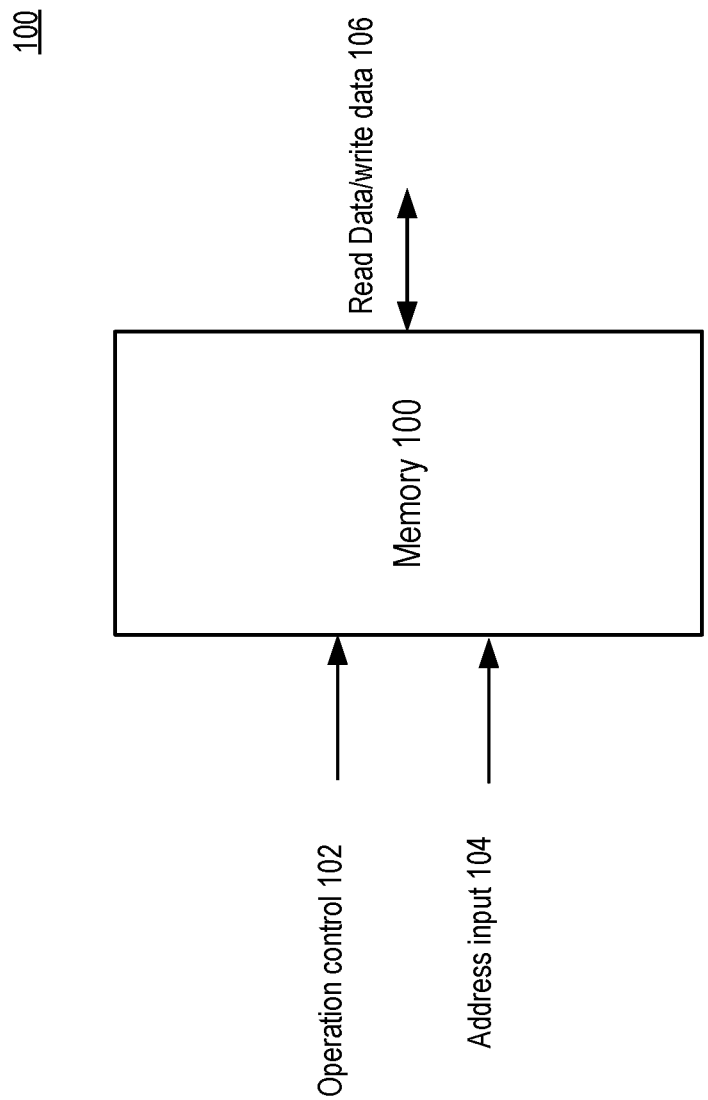
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for reading from and/or writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Accordingly, all references to the SRAM are intended only to illustrate exemplary aspects of the memory with the understanding that such aspects may be extended to a wide range of applications. In some examples, the described SRAM may be embedded with other integrated circuit (IC) blocks, such as processors, on a substrate. One such example of embedded SRAM is an application processor for wireless communication applications.

FIG. 1 is a block diagram of an exemplary embodiment of a memory 100. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for an operation control 102 for controlling an operation of the memory 100. For example, the memory 100 may operate in read, write, or various test modes. The memory 100 also includes inputs for the address (e.g., via the address input 104) and for write data (e.g., via the read data/write data 106) to be written to the memory 100 at the specified address. The memory further includes an output for read data (e.g., via the read data/write data 106) read from the memory 100 at the specified address. When writing data to the memory 100, a peripheral circuit sets the operation control 102 to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit.

Figure 2:
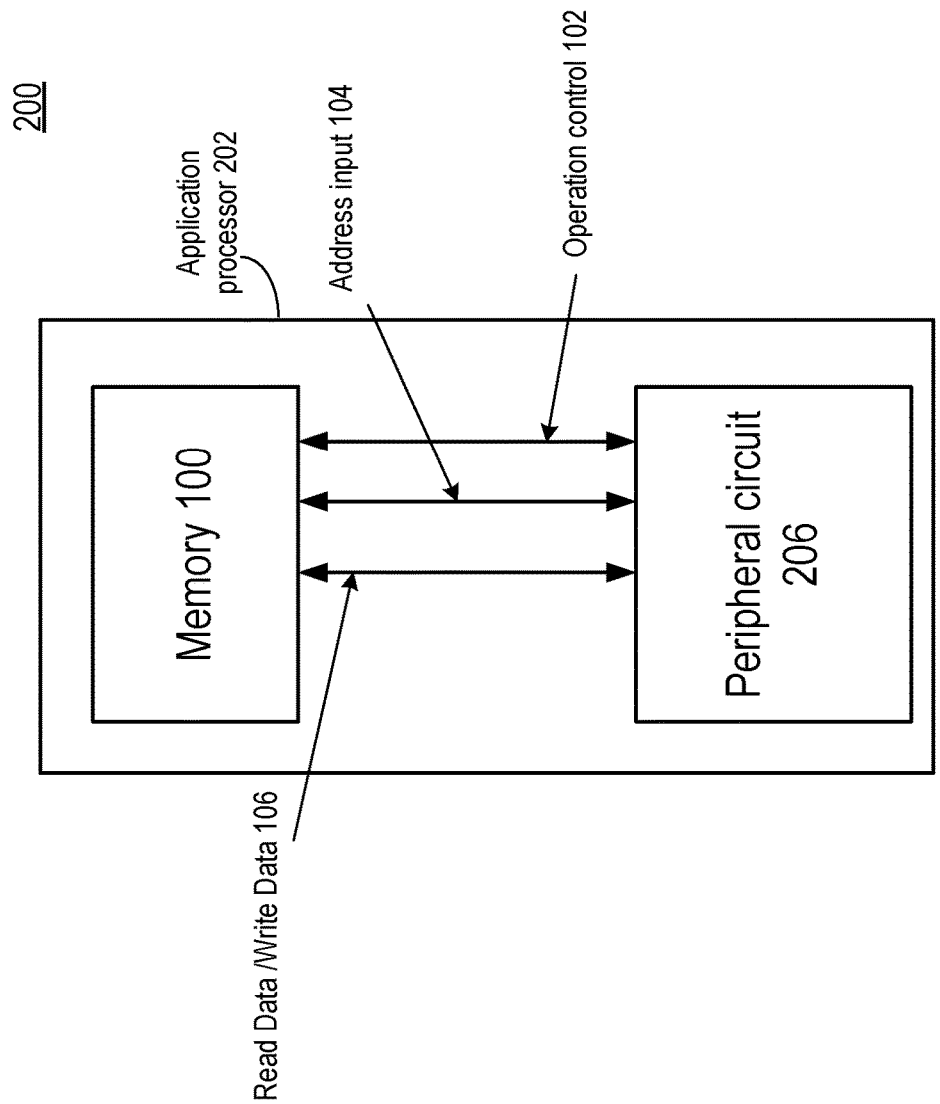
FIG. 2 is a block diagram of an exemplary embodiment of an application processor incorporating the memory of FIG. 1.

FIG. 2 is a block diagram of an exemplary embodiment of an application processor incorporating the memory of FIG. 1. The application processor 202 is provided as an example of an IC substrate having the memory 100 of FIG. 1 incorporated therein. As is known by a person of ordinary skill in the art, applications of the memory 100 are not limited thereto. In some examples, the application processor 202 may be incorporated in the IC substrate upon which the memory 100 and various processor cores are incorporated. A processor core may be a collection of circuits and may include an instruction execution unit. One of the processor cores may operate as or include the peripheral circuit 206. In some examples, the peripheral circuit 206 may be construed broadly to include any suitable circuit that is peripheral to the memory 100 and capable of accessing the memory 100. As described with FIG. 1, the peripheral circuit 206 may instruct the memory 100 to execute a read or write operation via the operation control 102 and the address input 104. The peripheral circuit 206 may further receive the read data from the memory 100 or provide the write data to the memory 100 via the read data/write data 106.

Figure 3:
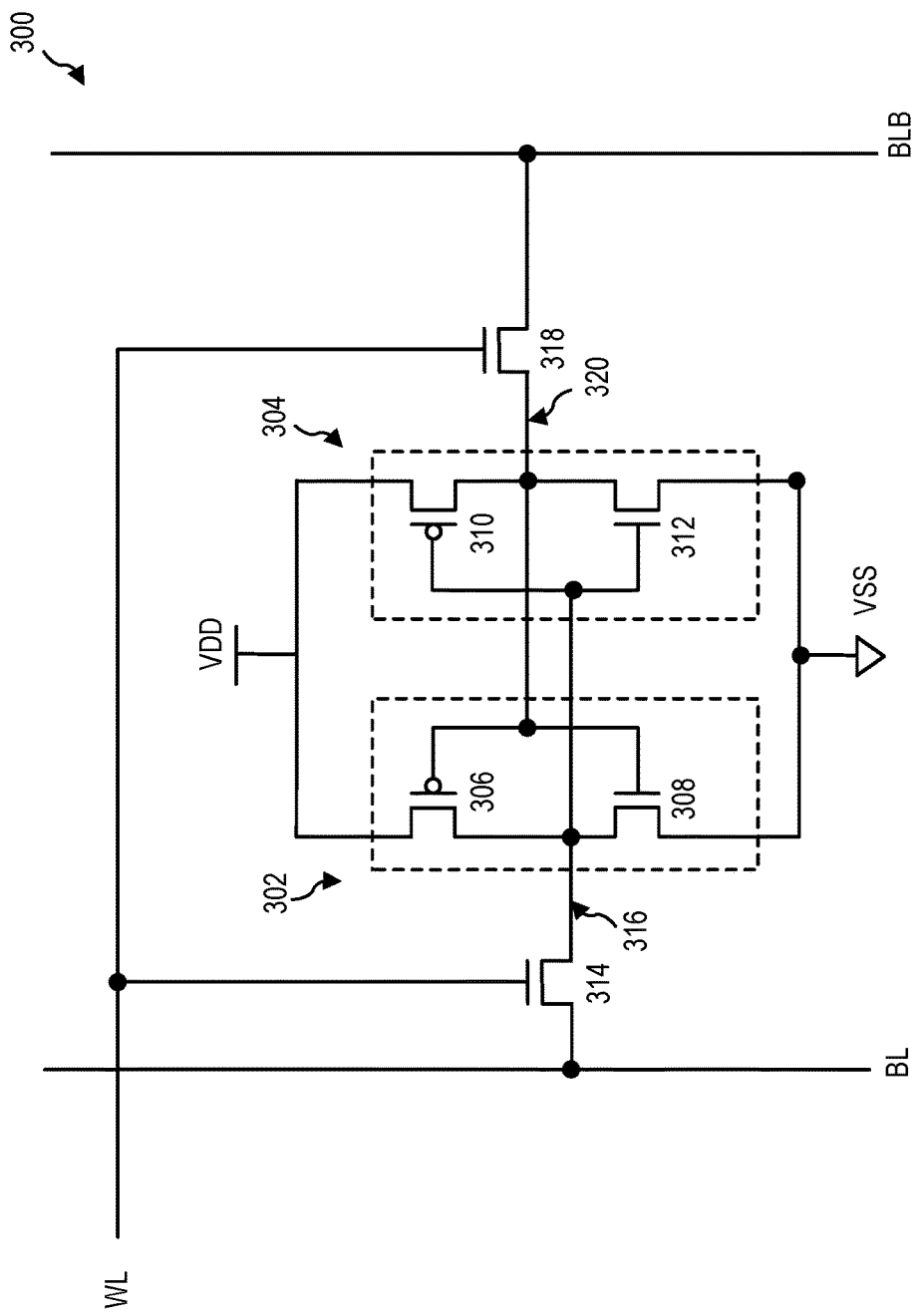
FIG. 3 is a circuit diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., logic 1 or logic 0). FIG. 3 is a circuit diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 includes a p-channel transistor 306 and an n-channel transistor 308. The second inverter 304 includes a p-channel transistor 310 and an n-channel transistor 312. In the described embodiment, the inverters 302 and 304 are powered by VDD and have a return VSS (e.g., ground). The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a predetermined level, which is determined so as not to disturb the stored data in the memory cell 300. In some examples, the precharge circuit BLPC 412 (see FIG. 4) precharges or pulls up the bitlines BL and BLB to a predetermined level that does not flip the stored data. The predetermined level may be a high level or VDD. In some examples, the predetermined level may be a portion (e.g., half) of VDD. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., VDD) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference on the bitline pair BL and BLB is thus established by the pulling-down of the bitline BL.

The bitlines BL and BLB are fed to a sense amplifier (SA), which senses the data (e.g., voltage difference) carried thereon and outputs a logic level (e.g., logic 1) as the read data to the peripheral circuit 206. The SA will be discussed in details infra.

A write operation may be initiated by setting the bitlines BL and BLB to the value to be written to the memory cell 300 and asserting the wordline WL. That is, the write data are driven onto the bitlines BL and BLB. The wordline WL may be asserted before or after the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver is designed to be stronger than the pull-up transistors (306 and 310) in the memory cell 300 so that the write data can override the previous state of the cross-coupled inverters 302, 304.

Once the read or write operation is complete, the wordline is de-asserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Various aspects of apparatuses and methods to enable a sense amplifier and/or a write driver will be presented with respect to an SRAM arranged as a PDP memory. However, as those skilled in the art will readily appreciate, the various aspects of methods and apparatus to enable a sense amplifier and/or a write driver presented throughout this disclosure and their numerous applications are not limited thereto. For example, the aspects presented may be applied to memories beyond the SRAM and PDP memories. Accordingly, all references to a specific application for the presented apparatus or method are intended only to illustrate exemplary aspects of the apparatus or method with the understanding that such aspects may have a wide differential of applications.

Figure 4:
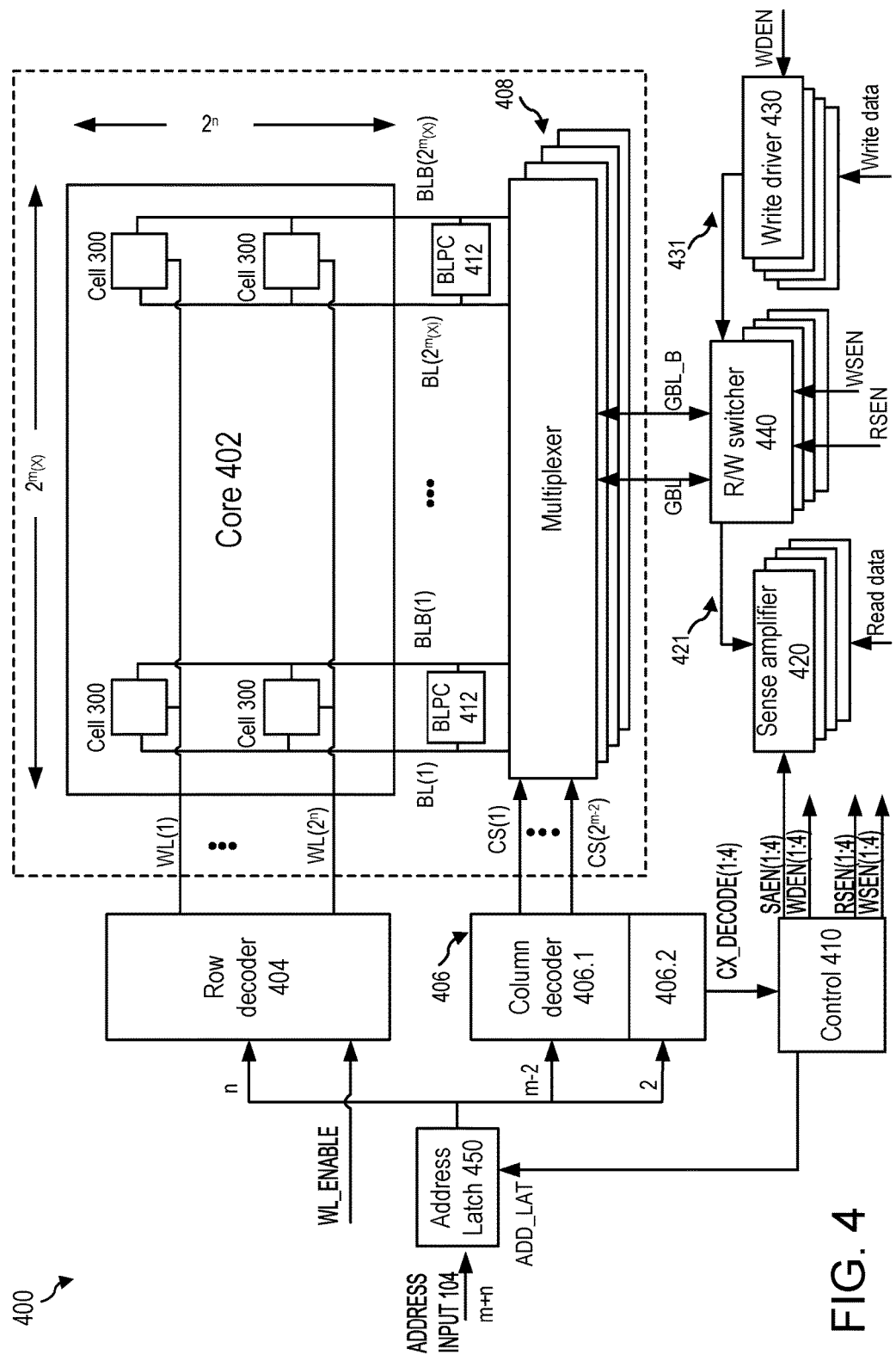
FIG. 4 is a functional block diagram of an exemplary embodiment of an SRAM.

FIG. 4 is a functional block diagram of an exemplary embodiment of an SRAM. The SRAM 400 is configured to operate a sense amplifier enabling scheme to improve, for example, a cycle time of the SRAM 400. In some examples, the SRAM 400 may be arranged as a PDP memory executing sequentially a read operation and then a write operation.

The SRAM 400 includes a core 402 with supporting circuitry to decode addresses and perform read and write operations. The core 402 includes memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors, including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in $2^n$ horizontal rows and $2^m(x)$ vertical columns, where $2^m$ is the number of words per row and x is the number of bits outputted for a read access. A peripheral device (not shown) may randomly access any word (i.e., x cells) in the core 402 using an address that is (n+m) bits wide. In other words, the SRAM 400 outputs x-bits read data for a read operation, and writes x-bits write data into the core 402 for a write operation.

The SRAM 400 includes address input circuits such as the address latch 450. The address latch 450 receives and latches the (n+m) bits of address from the address input 104 and is controlled by the control signal ADD_LAT. The control signal ADD_LAT may be generated and asserted by the control component 410 (e.g., control circuit or hardware/software combination to perform the function). By way of example, a component, or any portion of a component, or any combination of components may be implemented with one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Upon an assertion of the ADD_LAT signal, the address latch 450 latches the received address to decouple the address input 104 from the SRAM 400 (e.g., from the row decoder 404 and/or the column decoder 406). The latching of the address allows the next cycle address to be inputted onto the address input 104. Upon a de-assertion of the ADD_LAT signal, the address latch 450 is enabled to receive the address from the address input 104, and allows the received address to flow to the row decoder 404 and/or the column decoder 406.

In the SRAM 400, n-bits of the address are provided to the input of a row decoder 404 and m-bits of the address are provided to the input of a column decoder 406. The column decoder 406 may include the decoders 406.1 and 406.2. The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines BL and BLB through its access transistors as described above in connection with FIG. 3. The data stored in the memory cells are provided to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to the SAs 420 for amplification, and the resulting data of the amplification are outputted as read data.

In some examples, the row decoder 404 may be enabled or disabled (e.g., timed) by the signal WL_ENABLE. When the WL_ENABLE signal is de-asserted, the row decoder 404 does not assert any wordline. In this fashion, the WL_ENABLE signal may control a period and timing of asserting a wordline.

For column decoding, the SRAM 400 provides m−2 bits of address to the decoder 406.1, and provides the remaining two bits of address to the decoder 406.2. For reference, the two bits of address are referred to as CX address. The decoded CX address performs a portion of the column selection.

The decoder 406.1 provides $2^{m-2}$ outputs column selects (CS(1)–CS($2^{m-2}$)) with a different one of the outputs asserted for each different combination of address inputs. The outputs are provided to a set of multiplexers 408. By way of example, the multiplexers 408 may include passgates to perform the multiplexing function. The multiplexers 408 performs $2^{m-2}$:1 selection select one of $2^{m-2}$ bitline pairs from the memory core 402 based on the outputs from the decoder 406.1. Given that CX address includes two bits, four times x bits are selected and outputted as GBL and GBL_B pairs for each read or write access. The selected 4 times x GBL and GBL_B bitline pairs are coupled to SAs 420 and write drivers 430 via the read/write switcher 440. The signals SAEN(1:4) further selects x bits from the four times x bits to output as read data by selecting and enabling one of four SAs 420. The signals WDEN(1:4) further selects x bits from the four times x bits of write data to write into the memory cells 300 by selecting and enabling one of four wordline drivers 430.

The read/write switcher 440 is selected by signals RSEN and WSEN. For a read operation, one of the signals RSEN (1:4) may be selected and asserted. In response, the read/write switcher 440 couples or connects the memory cells, via the bitline pairs BL and BL_B, to the SAs 420. In some examples, the decoder 406.2 may be configured to decode the remaining two bits of the address (CX address) and to output the decoded address as CX_DECODE(1:4). The decoded address CX_DECODE(1:4) is provided to the control component 410 (e.g., circuits and/or combination of software/hardware performing the function). The control component 410, in response, incorporates the decoded address CX_DECODE(1:4) and generates the SA enabling signal SAEN for a time period. The SA enabling signal SAEN thus selects one set (e.g., x out of 4 times x) of SAs 420 to enable. The selected SAs 420 sense and amplify the data stored in the memory cells 300 (e.g., amplify the voltage differential on the connected bitline pair GBL and GBL_B flowing from the voltage differential on the connected bitline pair BL and BL_B). The selected SAs 420 output the amplified data as the (x-bit) read data.

Upon the SAs 420 being enabled, the SRAM 400 may transition from the read operation to the write operation. The control component 410 may control the read/write switcher 440 to decouple the SA 420 from the memory cells 300 and to couple the write drivers 430 to the memory cells 300 (via the bitline pairs GBL and GBL_B and the bitline pairs BL and BL_B). To this end, the control component 410 may de-assert the selected RSEN signal and select and assert one of the WSEN(1:4) signals.

Further, the control component 410 may assert and de-assert the control signal ADD_LAT and provide the ADD_LAT signal to the address latch 450. The asserted control signal ADD_LAT causes the address latch 450 to latch the received address and to decouple the address input 104 from the SRAM 400 (e.g., the row decoder 404 and/or the column decoder 406). The de-asserted ADD_LAT signal causes the address latch 450 to let the address (e.g., the CX address of the write address) to flow into the address decoder (e.g., the decoder 406.2) of the SRAM 400. The decoder 406.2 may accordingly output the decoded write CX address, CX_DECODE. Subsequently, the control component 410 may assert the ADD_LAT signal, and the address latch 450 may in response latch the write address and be ready to receive the address for the next cycle. The cycle time of the SRAM 400 may accordingly be shortened as a result.

Further in response to the SAs 420 being enabled, the control component 410 may select and assert one of the write driver enabling signals WDEN(1:4) for a second time period. The control component 410 may incorporate the decoded write address CX_DECODE(1:4) and generate the selected write driver enabling signal WDEN. The write driver enabling signal WDEN may thus select one set (e.g., x out of 4 times x) of write drivers 430 to enable. The selected write drivers 430 write or drivern the write data onto the connected bitline pairs GBL and GBL_B and the connected bitline pairs BL and BL_B for the write operation.

Figure 5:
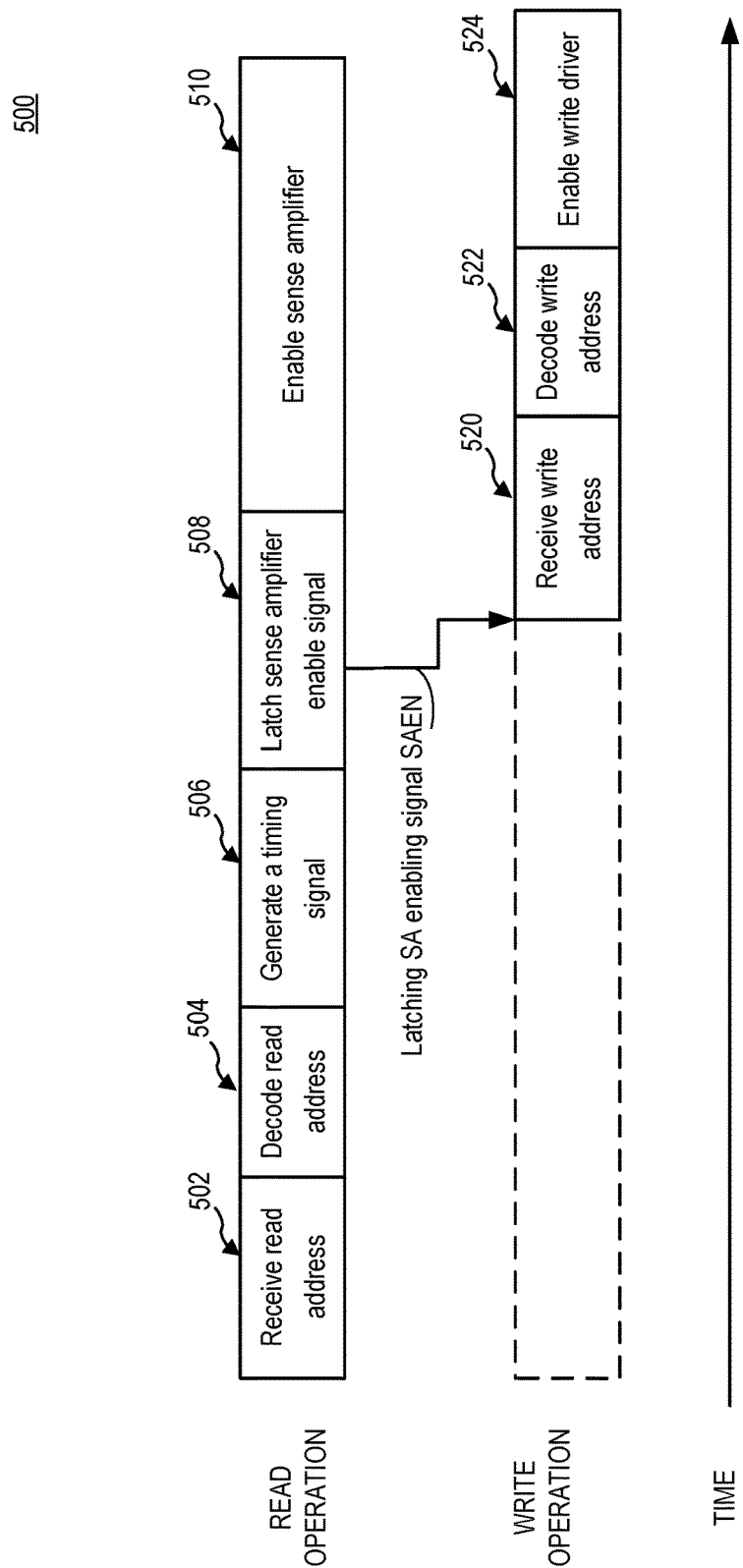
FIG. 5 is a block diagram of operations of the SRAM of FIG. 4.

FIG. 5 is a block diagram of operations of the SRAM of FIG. 4. The SRAM 400 performs a read operation and a write operation in a cycle. The read operation may include the operations 502, 504, 506, 508, and 510. The write operation may include the operations 520, 522, and 524.

At 502, a read address is received. In some examples, the address latch 450 receives the read address from the address input 104, and provides the read address to the row decoder 404 and the column decoder 406. At 504, the read address is decoded. For example, referring to FIG. 4, the row decoder 404 or the column decoder 406 may decode the read address. At 506, a timing signal SA_TIME is generated. In some examples, the control component 410 may generate the timing signal SA_TIME to enable the SAs 420 and/or the write drivers 430. In some examples, the control component 410 may generate an SA enabling signal SAEN based on the timing signal SA_TIME. At 508, the sense amplifier enable signal is latched. In some examples, the control component 410 generates and latches the SA enabling signal SAEN, and provides the latched SAEN signal to the SAs 420 to enable the selected SAs 420. The control component 410 may incorporate the decoded address CX_DECODE(1:4) and generate the SA enabling signal SAEN. The SA enabling signal SAEN may thus select one set (e.g., x out of 4 times x) of SAs 420 to enable. At 510, the SA 420s are selected and enabled by the latched SAEN signal as described above.

At 520, a write address is received. For example, the address decoder (e.g. row decoder 404 and/or column decoder 406) may receive the write address from the address latch 450. Upon the latching of the SA enabling signal SAEN, a write address may be placed on the address input 104. Thus, the latching of the SA enabling signal SAEN allows the write address to be received earlier in the cycle and shortens the cycle time. The address latch 450 receives the write address and provides the write address to the address decoder (e.g. row decoder 404 and/or column decoder 406).

The control component 410, in response to the assertion of the timing signal SA_TIME, may assert the control signal ADD_IN and provide the ADD_IN signal to the address latch 450. Thus, the write address may flow into the row decoder 404 and/or the column decoder 406, and may be latched in response to the ADD_IN signal. In some examples, only the CX address of the write address may be received at this stage. The CX address may be decoded to select and enable the write drivers 430 as the first operation of the write operation.

At 522, the write address is decoded. For example, referring to FIG. 4, the row decoder 404 and/or the column decoder 406 may decode the write address. For example, the decoder 460.2 may decode the CX address of the write address to generate the decoded (write) address CX_DECODE(1:4). In some examples, only the CX address is decoded at this stage. For example, the decoder 406.2 may decode the CX address of the write address while the decoder 406.1 remains decoding the (m−2)-bit of the read address. In this fashion, the first operation for the write operation (e.g., enabling the write driver 430 to write the write data into the bitlines) may be performed while the read operation is ongoing (e.g., the SAs 420 being enabled to read out the stored data).

At 524, a write driver is enabled to provide the write data to the memory cell. In some examples, the control component 410 may assert the write driver enabling signal WDEN for the second time period. The control component 410 may incorporate the decoded (write) address CX_DECODE(1:4) and generate the write driver enabling signal WDEN. The write driver enabling signal WDEN may thus select one set (e.g., x out of 4 times x) of write drivers 430 to enable. The selected write drivers 430 output the write data onto the connected bitline pairs GBL and GBL_B and the connected bitline pairs BL and BL_B for the write operation.

FIG. 5 further illustrates the time axis. In some examples, the operations 520 (receiving the write address), 522 (decoding the write address) and 524 (enabling the write driver 430) may occur while the SAs 420 are enabled.

Figure 6:
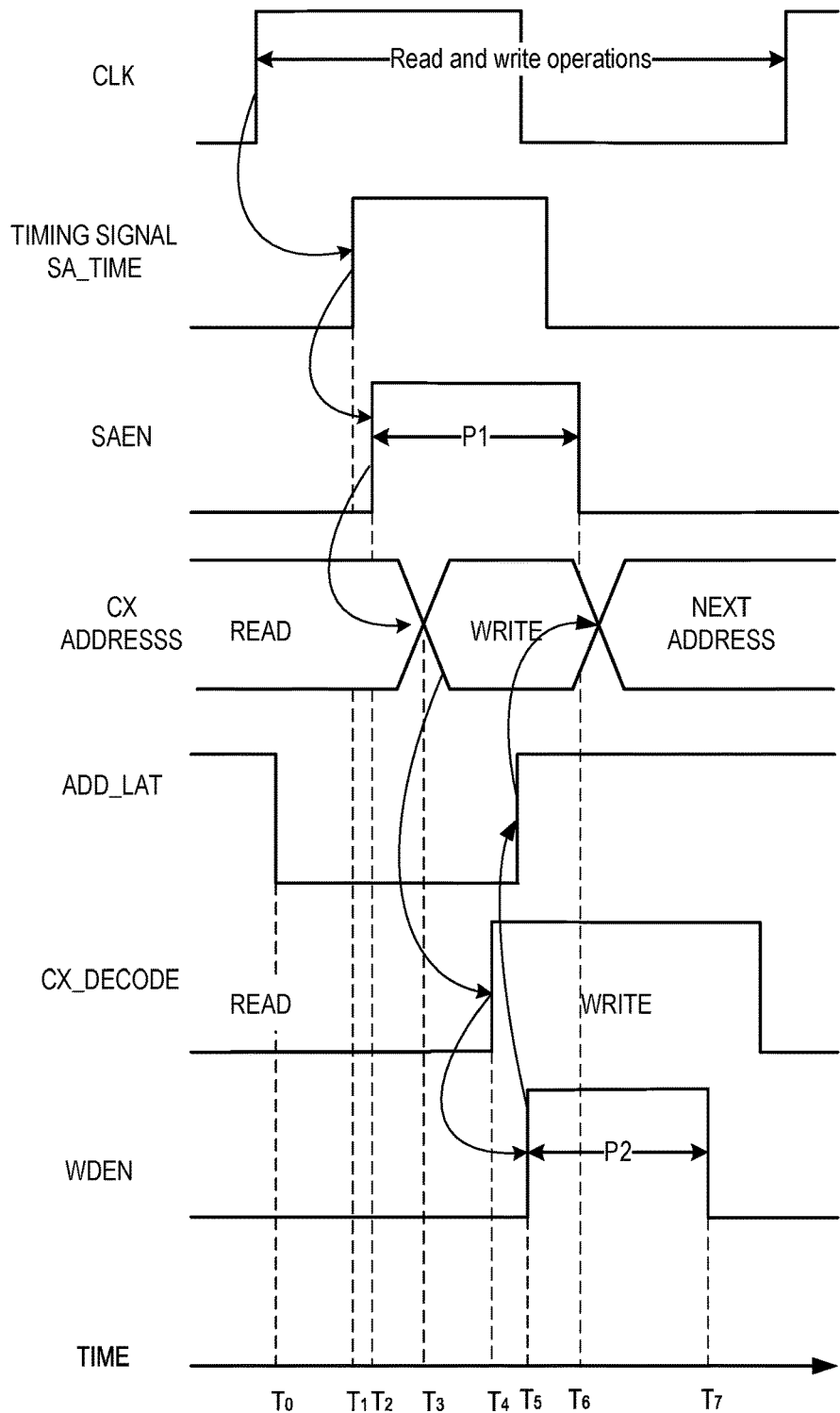
FIG. 6 is a timing diagram of operations of the SRAM of FIG. 4.

FIG. 6 is a timing diagram of operations of the SRAM of FIG. 4. The clock signal CLK controls the SRAM 400 to perform the read operation and followed by the write operation within a cycle. The CX address of the read/write address is used as an example in figure, but the scope of the disclosure is not so limited.

At $T_0$, the signal ADD_LAT is de-asserted, and at least the CX address of the read address is received (e.g., the CX address labeled "read" in the figure). For example, the address latch 450 receives the CX address of the read address and provides the CX address to the column decoder 406. At $T_1$, the control component 410 may generate a timing signal SA_TIME (e.g., based on the clock CLK). Examples of the timing signal SA_TIME and the assertion thereof are presented with FIG. 7. The control component 410 may latch the decoded CX address, CX_DECODE, of the read address (e.g., the CX_DECODE labeled "read" in the figure) to generate the SA enabling signal SAEN. At $T_2$, signal SAEN is generated. For example, the control component 410 may generate and latch the SAEN signal for a time period P1 (from $T_2$ to $T_6$), based on the latched decoded CX address CX_DECODE. Examples of these features presented with FIG. 7.

At $T_3$, the write address is received. Upon the latching of the SA enabling signal SAEN, the SRAM 400 (e.g., the row decoder 404 and/or the column decoder 406) may be ready to receive the write address to shorten the cycle time. In this example, the CX address of the write address (e.g., the CX address labeled "write" in the figure) is received to be decoded (for the enabling of the write drivers 430) as the first operation of the write operation. At $T_4$, the decoder 406.2 decodes the CX address of the write address to generate the decoded (write) address CX_DECODE, and provides the decoded (write) address CX_DECODE (e.g., the CX_DECODE labeled "write" in the figure) to the control component 410.

At $T_5$, the control component 410 generates the write driver enabling signal WDEN for a time period P2 (from $T_5$ to $T_7$), based on the decoded (write) address CX_DECODE. In some examples, the decoded (write) address CX_DECODE and/or the write driver enabling signal WDEN are latched to free the address latch 450 to receive to the next cycle address. The control component 410 may, in response to the latching of the decoded (write) address CX_DECODE and/or the latching of the write driver enabling signal WDEN, de-assert the control signal ADD_LAT to allow the address input circuit (e.g., the address latch 450) to receive the next cycle address (e.g., the CX address labeled "next address"). In this fashion, the cycle time of current cycle, including the read operation followed by the write operation, is reduced.

Figure 7:
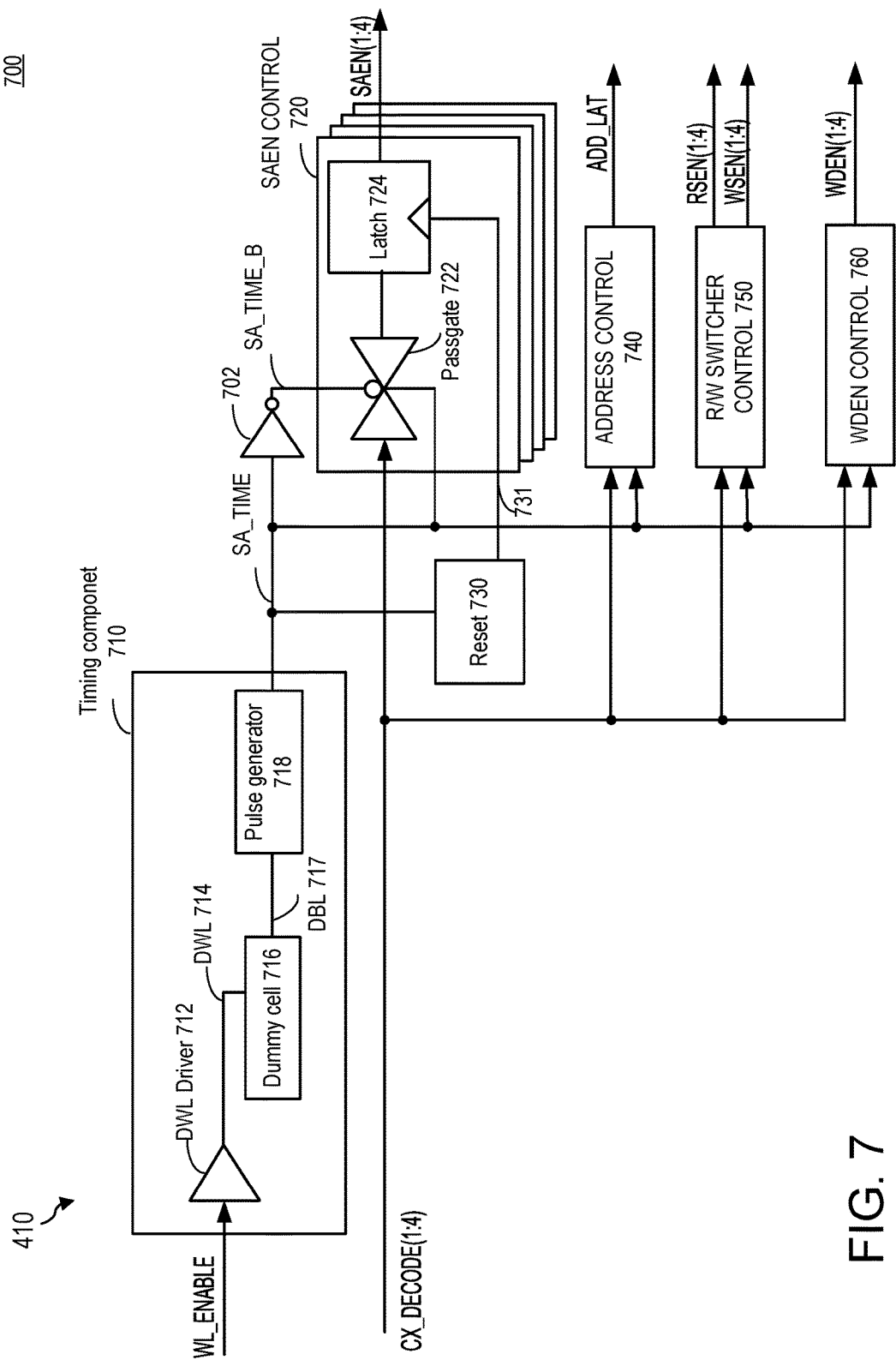
FIG. 7 is a circuit diagram of an exemplary embodiment of the control component.

FIG. 7 is a circuit diagram of an exemplary embodiment of the control component. The circuit diagram 700 depicts components to generate various timing signals, and the generation of the timing signal SA_TIME is shown as an example. As understood by persons of ordinary skill in the art, a timing signal is arranged such that the timing signal is asserted or de-asserted before or after certain events. For example, the timing signal SA_TIME may be asserted after the decoded address CX_DECODE is valid, such that the assertion of the SA enabling signal SAEN (based on the decoded address CX_DECODE) does not falsely enable the unselected SAs. Various delay stages are omitted for clarity.

The control component 410 may include the timing component 710, the SAEN control component 720, the reset component 730, the address control component 740, the R/W switcher control component 750, and the WDEN control component 760. The timing component 710 provides the means to generate a timing signal to enable the SAs 420 and to latch the write address (e.g., the decoded CX_DECODE). The timing component 710 further provides the means to signal the WDEN control component 760 to enable the write driver 430 during at least the portion of the time period P1. In some configurations, the timing component 710 provides the means to control the read/write switcher 440 to switch the memory cell 300 between the SA 420 and the write driver 430. See, for example, FIG. 8 for more details regarding the read/write switcher 440.

The timing component 710 may be triggered by the WL EN signal and include a dummy wordline (DWL) driver 712 outputting the DWL signal 714. A dummy cell 716 emulates the memory cell 300 (e.g., by emulating the biline and/or wordline loadings thereof). As is known in the art, the dummy cell 716 need not be an actual memory cell but may include resistors and capacitors to match an electrical parameter (e.g., RC characteristic) of the memory cell 300. As would be understood by a person or ordinary skill in the art, the matching of electrical characteristic of the memory cell 300 may refer to meeting certain design criteria. For example, such design criteria may be that the SAs 420 are not enabled too early to cause a false read at the SAs 420 or too late to cause a performance issue. The dummy cell 716 receives the DWL signal 714 and outputs the dummy bitline (DBL) signal 717. The pulse generator 718 receives the DBL signal 717 and outputs the timing signal SA_TIME as a pulse.

The SAEN control component 720 provides the means to enable the SA 420 during a time period P1. The SAEN control component 720 may further provide the means to latch an output from the address decoder 406.2 to enable the SA 420. The SAEN control component 720 receives the timing signal SA_TIME and the decoded address CX_DECODE (1:4) to select and to generate one of the SAEN(1:4) signals. The selected SAEN signal enables the corresponding SAs 420. As depicted, the SAEN control component 720 may utilize a passgate 722 and the latch 724 to generate the SAEN signal. The pulsing of the timing signal SA_TIME allows the passgate 722 to pass the decoded address CX_DECODE to the latch 724 to be latched. The reset component 730 may be triggered by the timing signal SA_TIME to generate the RESET signal 731, after a delay of a time period P1. The RESET signal 731 resets or zeros the latch 724. In such fashion, the latch 724 latches both the decoded address CX_DECODE and the SA enabling signal SAEN for the time period P1, allowing for write address to be provided to the decoder 406.2.

Upon the enabling of the SAs 420 (e.g., during the time period P1), the write address may be placed on the address input 104. The address input circuit (e.g., the address latch 450) may receive the write address and provide the write address to the address decoder, such as the decoder 406.2. The decoder 406.2 accordingly provides the means to decode a write address to enable the write driver 430 while the SA 420 is enabled. In some configurations, the decoder 406.2 provides the means to enable the write driver 430 following the latching of the address decoder output (e.g., the decoded read address CX_DECODE outputted by the decoder 406.2).

The address control component 740 may likewise be triggered by the timing signal SA_TIME or any signals based on the SA_TIME signal. The address control component 740 may in response to the triggering by asserting ADD_LAT signal. As described with FIGS. 4 and 6, the ADD_LAT signal is asserted to latch the write address and to allow the address latch 450 to receive the next cycle address. In such fashion, the address latch 450 provides the means to receive a write address while the SAs 420 are enabled (e.g., during the time period P1).

Figure 8:
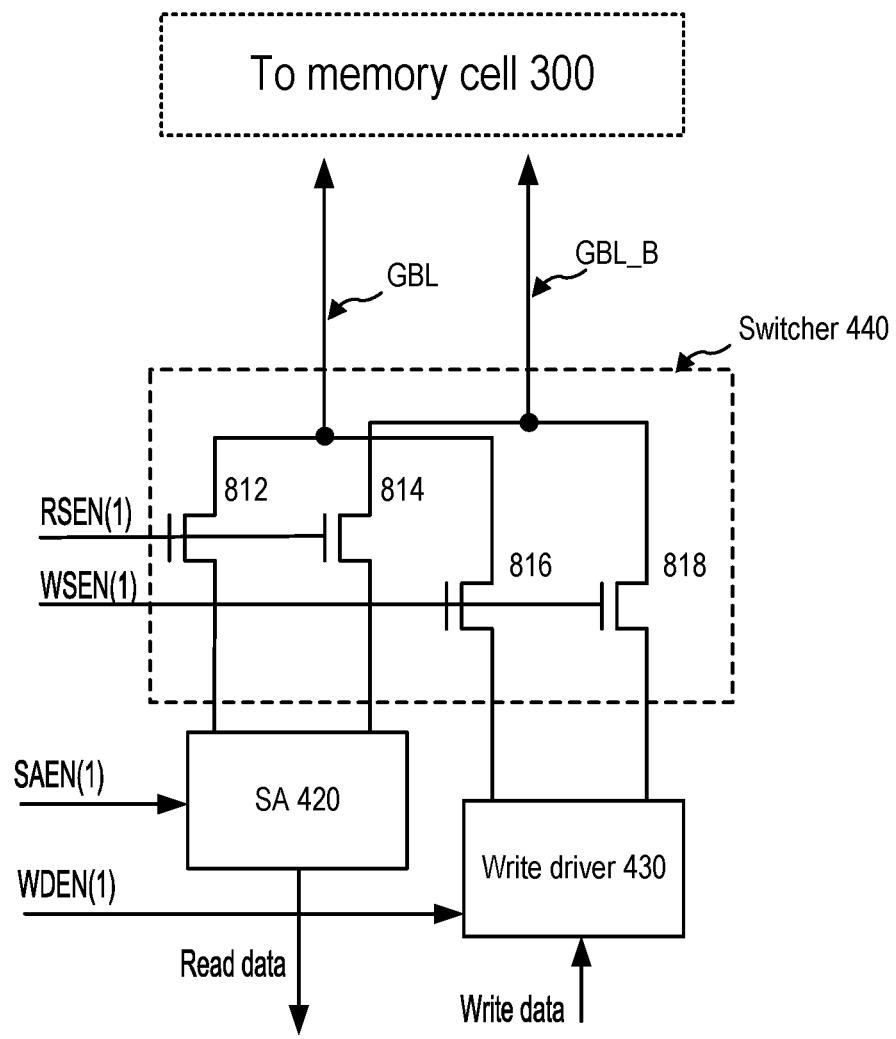
FIG. 8 is a circuit diagram of an exemplary embodiment of a read/write switcher and the associated sense amplifier and write driver.

The R/W switcher control component 750 may likewise be triggered by the timing signal SA_TIME or any signals based on the SA_TIME signal. In response to the triggering, the R/W switcher control component 750 may switch the memory cell 300 from coupling to the SA 420 to coupling the write driver 430. The R/W switcher control component 750 may de-assert the selected RSEN signal and select and assert, based on the decoded write address CX_DECODE, one of the WSEN(1:4) signals. The RSEN(1:4) and the WSEN(1:4) signals are provided to the read/write switcher 440 to control the coupling of the memory cell 300. FIG. 8 and the corresponding text describe an embodiment of the read/write switcher 440.

The WDEN control component 760 may provide means to enable the write driver 430 during at least a portion of the time period P1. In some configurations, the WDEN control component 760 to enable the write driver 430 during at least a portion of the time period P1. The WDEN control component 760 may likewise be triggered by the timing signal SA_TIME or any signals based on the SA_TIME signal. Subsequent to the assertion of the selected WSEN signal, WDEN control component 760 may select one of the WDEN(1:4) signals based on the decoded write address CX_DECODE. The WDEN control component 760 may assert the selected WDEN signal for a time period P2, and thereby enable the selected write drivers 430 to provide write data to the memory cell 300 for the time period P2. The time period P2 begins during the time period P1 and ends after the time period P1 ends.

FIG. 8 is a circuit diagram 800 of an exemplary embodiment of a read/write switcher and the associated sense amplifier and write driver. The circuit diagram 800 includes a one set of read/write switcher 440 controlled by signals RSEN(1) and WSEN(1) and the associated SA 420 (controlled by signal SAEN(1)) and the write driver (controlled by the signal WDEN (1)). Given that the CX address includes two bits of address in the exemplary embodiment, four instances of the circuit diagram 800 may be available for each bit of read and write data.

The read/write switcher 440 provides the means to switch the memory cell 300 between the SA 420 and the write driver 430. The read/write switcher 440 includes n-type transistors 812 and 814 coupling the bitline pair GBL and GBL_B (which is coupled to the memory cell 300) to the SA 420. The transistors 812 and 814 are controlled by the signal RSEN(1). The read/write switcher 440 further includes n-type transistors 816 and 818 coupling the bitline pair GBL and GBL_B (which is coupled to the memory cell 300) to the write driver 430. The transistors 816 and 818 are controlled by the signal WSEN(1).

In a case the signal RSEN(1) is asserted and the signal WSEN(1) is de-asserted, the transistors 812 and 814 are turned on to couple or connect the SA 420 to the bitline pair GBL and GBL_B (and therefore the memory cell 300). Thus, the SA 420 may sense the read data stored in the memory cell 300. The transistors 816 and 818 are turned off to decouple or disconnect the write driver 430 from the bitline pair GBL and GBL_B (and therefore the memory cell 300). In a case the signal RSEN(1) is de-asserted and the signal WSEN(1) is asserted, the transistors 816 and 818 are turned on to couple or connect the write driver 430 to the bitline pair GBL and GBL_B (and therefore the memory cell 300). Thus, the write driver 430 may provide or write the write data into the memory cell 300. The transistors 812 and 814 are turned off to decouple or disconnect the SA 420 from the bitline pair GBL and GBL_B (and therefore the memory cell 300). In a case that the CX address does not select this instance of circuit diagram 800, both the signals RSEN(1) and WSEN(1) may be de-asserted to turn off the transistors 812, 814, 816, and 818, and both the SA 420 and the write driver 430 are decoupled or disconnected from the bitline pair GBL and GBL_B (and therefore the memory cell 300).

Figure 9:
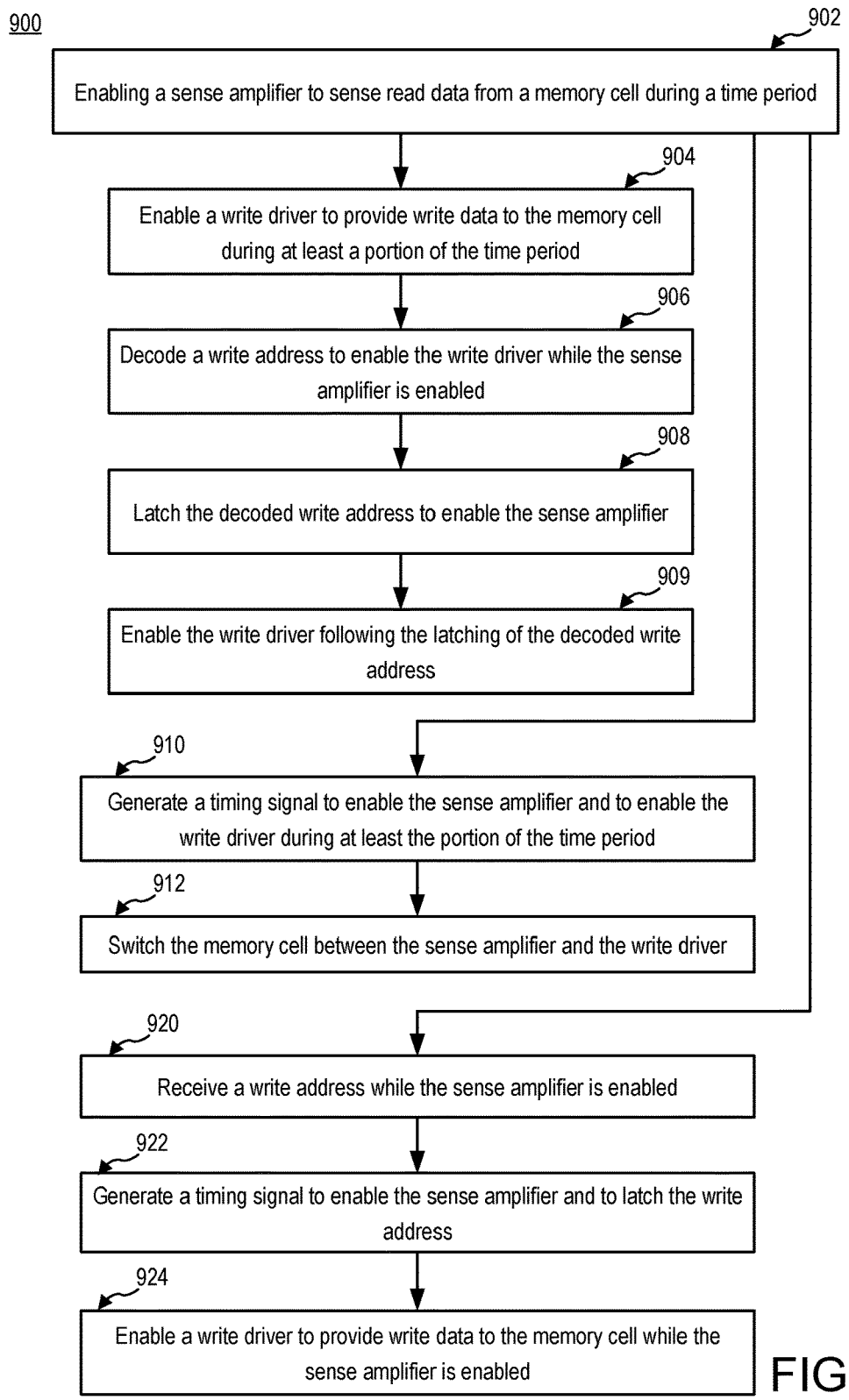
FIG. 9 is a flowchart for operating the SRAM of FIG. 4.

FIG. 9 is a flowchart for operating the SRAM of FIG. 4. The flowchart 900 depicts a method for operating the SRAM 400 and may be performed by components and/or circuits presented with FIGS. 4, 7, and 8.

At 902, a sense amplifier is enabled to sense read data from a memory cell during a time period. For example, the SA 420 may be enabled to sense read data from the associated memory cell 300 via the bitline pair GBL and GBL_B and the bitline pair BL and BL_B. Referring to FIG. 7, the control component 410 may assert the SAEN signal to enable the SA 420 for a time period P1.

At 904, a write driver is enabled to provide write data to the memory cell during at least a portion of the time period. For example, the write driver 430 may be enabled to provide or write the write data to the memory cell 300 via the bitline pair GBL and GBL_B and the bitline pair BL and BL_B.

Referring to FIG. 7, the control component 410 may assert the WDEN signal to enable the write drivers 430 for a time period P2. Referring to FIG. 6, the time period P2 may begin during the time period P1 and end after the time period P2 ends.

At 906, a write address is decoded to enable the write driver while the sense amplifier is enabled. At 908, the decoded write address is decoded to enable the sense amplifier. At 909, the write driver is enabled following the latching of the decoded write address. Referring to FIG. 7, the SAEN control component 720 latches the decoded address CX_DECODE to generate the SA enabling signal SAEN. Upon latching the decoded address CX_DECODE, the write address may be inputted to the SRAM 400 (see, e.g., FIG. 6 at $T_3$; the CX address of the write address is inputted). The decoder 406.2 decodes the write address to output the decoded (write) address CX_DECODE. The WDEN control component 760 generates the write driver enabling signal WDEN to enable the write drivers 430 while the SA 420 is enabled (e.g., within the time period P1).

At 910, a timing signal is generated to enable the sense amplifier and to enable the write driver during at least the portion of the time period. For example, referring to FIG. 7, the timing component 710 generates the timing signal SA_TIME. In some examples, the timing signal SA_TIME may be generated based on a parameter of the memory cell, such as the bitline or wordline loading. The SAEN control component 720 generates the SA enabling signal SAEN to enable to SA 420, based on the timing signal SA_TIME. The WDEN control component 760 generates the write driver enabling signal WDEN to enable to write driver 430, based on the timing signal SA_TIME. The write drivers 430 are enabled during at least a portion of the time period P1 (e.g., the write drivers 430 are enabled for a time period P2, which overlaps the time period P1).

At 912, the memory cell is switched between the sense amplifier and the write driver. Referring to FIG. 8, the read/write switcher 440 provides the means to switch the memory cell 300 between the SA 420 and the write driver 430. The read/write switcher 440 includes n-type transistors 812 and 814 coupling the bitline pair GBL and GBL_B (which is coupled to the memory cell 300) to the SA 420. The transistors 812 and 814 are controlled by the signal RSEN(1). The read/write switcher 440 further includes n-type transistors 816 and 818 coupling the bitline pair GBL and GBL_B (which is coupled to the memory cell 300) to the write driver 430. The transistors 816 and 818 are controlled by the signal WSEN(1). The R/W switcher control component 750 generates the controls signals RSEN and WSEN to effect the switching of the memory cell 300 between the SA 420 and the write driver 430 based on the timing signal SA_TIME.

At 920, a write address is received while the sense amplifier is enabled. Referring to FIG. 7, the SAEN control component 720 latches the decoded address CX_DECODE to generate the SA enabling signal SAEN. Upon latching the decoded address CX_DECODE, the write address may be inputted to the SRAM 400 (see, e.g., FIG. 6 at $T_3$; the CX address of the write address is inputted). In some examples, the address latch 450 receives the write address while the SA 420 is enabled (e.g., during time period P1).

At 922, a timing signal is generated to enable the sense amplifier and to latch the write address. At 924, a write driver is enabled to provide write data to the memory cell while the sense amplifier is enabled. For example, referring to FIG. 7, the timing component 710 generates the timing signal SA_TIME. Referring to FIG. 7, the control component 410 may assert the SAEN signal to enable the SA 420 for a time period P1. The WDEN control component 760 generates the write driver enabling signal WDEN to enable to write driver 430, based on the timing signal SA_TIME. The WDEN control component 760 latches the write address (e.g., the decoded write address CX_DECODE) based on the timing signal SA_TIME.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory, comprising:
   a memory cell;
   a sense amplifier configured to sense read data from the memory cell;
   a write driver configured to provide write data to the memory cell;
   a first circuit configured to enable the sense amplifier during a time period;
   a second circuit configured to enable the write driver for a second time period that begins during the time period and ends after the time period ends; and
   an address decoder configured to decode a write address to enable the write driver while the sense amplifier is enabled, and
   wherein the first circuit is further configured to latch an output from the address decoder to enable the sense amplifier.

2. The memory of claim 1, wherein the address decoder is further configured to enable the write driver following the latching of the address decoder output.

3. The memory of claim 1, further comprising a timing circuit configured to signal the first circuit to enable the sense amplifier and to signal the second circuit to enable the write driver during at least a portion of the time period.

4. The memory of claim 3, wherein the timing circuit is further configured to signal the first circuit to enable the sense amplifier based on a parameter of the memory cell.

5. The memory of claim 3, further comprising a switcher configured to switch the memory cell between the sense amplifier and the write driver.

6. The memory of claim 5, wherein the timing circuit is further configured to control the switcher to switch the memory cell between the sense amplifier and the write driver.

7. The memory of claim 1, wherein the beginning of the second time period during the time period is indicated by a write enable signal being in an active state before a falling edge of a sense enable signal.

8. A method for operating a memory, comprising:
enabling a sense amplifier to sense read data from a memory cell of the memory during a time period;
enabling a write driver to provide write data to the memory cell for a second time period that begins during the time period and ends after the time period ends;
decoding a write address to enable the write driver while the sense amplifier is enabled; and
latching the decoded write address to enable the sense amplifier.

9. The method of claim 8, further comprising enabling the write driver following the latching the decoded write address.

10. The method of claim 8, further comprising
generating a timing signal to enable the sense amplifier and to enable the write driver during at least a portion of the time period.

11. The method of claim 10, wherein the generating the timing signal is based on a parameter of the memory cell.

12. The method of claim 10, further comprising switching the memory cell between the sense amplifier and the write driver.

13. The method of claim 12, wherein the switching the memory cell between the sense amplifier and the write driver is based on the timing signal.

14. A memory, comprising:
a memory cell;
a sense amplifier configured to sense read data from the memory cell;
a circuit configured to enable the sense amplifier, the circuit further configured to enable the sense amplifier further configured to latch a decoded address to enable the sense amplifier; and
an address input circuit configured to receive a write address before the sense amplifier is enabled to perform a previously started read operation.

15. The memory of claim 14, further comprising:
a timing circuit configured to signal the circuit to enable the sense amplifier and signal a latch to latch the write address.

16. The memory of claim 15, further comprising:
a write driver configured to provide write data to the memory cell; and
a second circuit configured to enable the write driver while the sense amplifier is enabled.

17. The memory of claim 16, wherein the timing circuit is further configured to signal the second circuit to enable the write driver while the sense amplifier is enabled.

18. A method for operating a memory, comprising:
enabling a sense amplifier to sense read data from a memory cell of the memory;
receiving a write address before the sense amplifier is enabled to perform a previously started read operation;
decoding the write address to enable a write driver while the sense amplifier is enabled; and
latching the decoded write address to enable the sense amplifier.

19. The method of claim 18, further comprising:
generating a timing signal to enable the sense amplifier and to latch the write address.

20. The method of claim 19, further comprising:
enabling the write driver to provide write data to the memory cell while the sense amplifier is enabled.

\* \* \* \* \*